(12) United States Patent
Hung et al.

(10) Patent No.: US 7,986,521 B2
(45) Date of Patent: Jul. 26, 2011

(54) HEAT DISSIPATION DEVICE AND COMPUTER USING SAME

(75) Inventors: Jui-Wen Hung, Taipei Hsien (TW);
Ching-Bai Hwang, Taipei Hsien (TW);
Jie Zhang, Shenzhen (CN)

(73) Assignees: Furui Precise Component (Kunshan) Co., Ltd., KunShan, Jiangsu Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 147 days.

(21) Appl. No.: 12/465,628

(22) Filed: May 13, 2009

(65) Prior Publication Data

US 2010/0053884 A1 Mar. 4, 2010

(30) Foreign Application Priority Data

Aug. 29, 2008 (CN) .......................... 2008 1 0304315

(51) Int. Cl.
*H05K 7/20* (2006.01)
*F28F 7/00* (2006.01)
*H01L 23/34* (2006.01)

(52) U.S. Cl. .............. 361/679.49; 361/679.51; 361/695; 361/697; 165/80.3; 257/722; 174/16.3

(58) Field of Classification Search .................. 361/679.49–679.51, 695, 697, 361/700, 703; 165/80.1–80.5, 104.33, 185; 257/718–719, 721, 722; 174/15.2, 16.3, 16.1; 454/184

See application file for complete search history.

(56) References Cited

U.S. PATENT DOCUMENTS

| | | | |
|---|---|---|---|
| 6,643,131 B1 * | 11/2003 | Huang | 361/697 |
| 6,802,362 B2 * | 10/2004 | Wenger et al. | 165/104.33 |
| 7,411,786 B2 * | 8/2008 | Wang et al. | 361/695 |
| 7,492,590 B2 * | 2/2009 | Chen et al. | 361/695 |
| 7,746,632 B2 * | 6/2010 | Song et al. | 361/679.49 |
| 2004/0004812 A1 * | 1/2004 | Curlee et al. | 361/687 |
| 2007/0097633 A1 * | 5/2007 | Chen et al. | 361/695 |
| 2009/0168330 A1 * | 7/2009 | Li et al. | 361/679.47 |
| 2010/0319886 A1 * | 12/2010 | Zeng et al. | 165/122 |

* cited by examiner

*Primary Examiner* — Zachary M Pape
(74) *Attorney, Agent, or Firm* — Frank R. Niranjan

(57) ABSTRACT

A heat dissipation device includes a fin unit, a fan and a fan duct. The fin unit includes a plurality of fins stacked together. An airflow channel is defined between each two neighboring fins. The fan includes an air inlet and an opposite air outlet. The fan duct communicates the airflow channels of the fin unit and the fan. The fan duct includes a first flue connected to the air inlet of the fan and a second flue connected to the fin unit. The second flue includes a first side plate and a second side plate covering on two neighboring sides of the fin unit, respectively.

11 Claims, 6 Drawing Sheets

HEAT DISSIPATION DEVICE AND COMPUTER USING SAME

BACKGROUND

1. Technical Field

The present disclosure relates to heat dissipation, and more particularly to a heat dissipation device for dissipating heat generated by an electronic component and a computer using same.

2. Description of Related Art

Electronic components operating at high speed generate excessive heat which must be displaced efficiently to ensure normal operation. Typically, a heat dissipation device provides such heat dissipation.

Conventionally, the heat dissipation device includes a heat sink mounted on a CPU inside a casing of an electronic device, and a cooling fan mounted on one side of the heat sink. The fan generates air currents flowing through the heat sink, causing heat of the heat sink absorbed from the CPU to be dissipated into the surrounding air. However, most of hot air after flowing through the heat sink remains inside the casing, and can not escape to an exterior of the casing. The hot air within the casing results in temperature increasing of the surrounding air, and finally a heat exchange between the interior surrounding air and the heat sink is decreased. Consequently, a heat dissipation efficiency of the conventional heat dissipation device is inefficient, often does not satisfy heat dissipation requirement of the electronic device.

For the foregoing reasons, therefore, there is a need in the art for a heat dissipation device which overcomes the above-mentioned problems.

DETAILED DESCRIPTION

Figure 1:
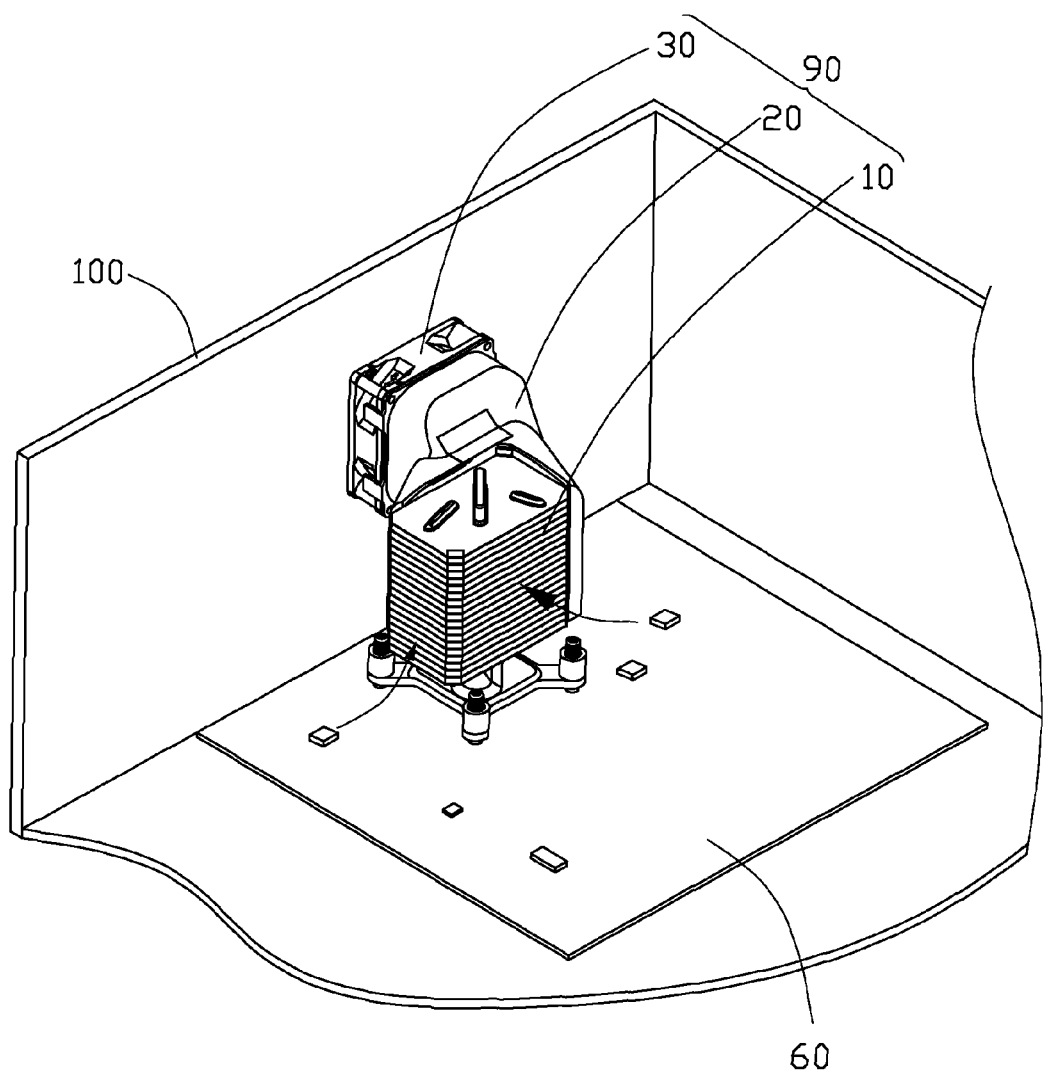
FIG. 1 is a schematic, assembled view of a computer with a heat dissipation device mounted in the computer in accordance with a first embodiment.

Reference will now be made to the drawing figures to describe the present heat dissipation device in detail.

Figure 2:
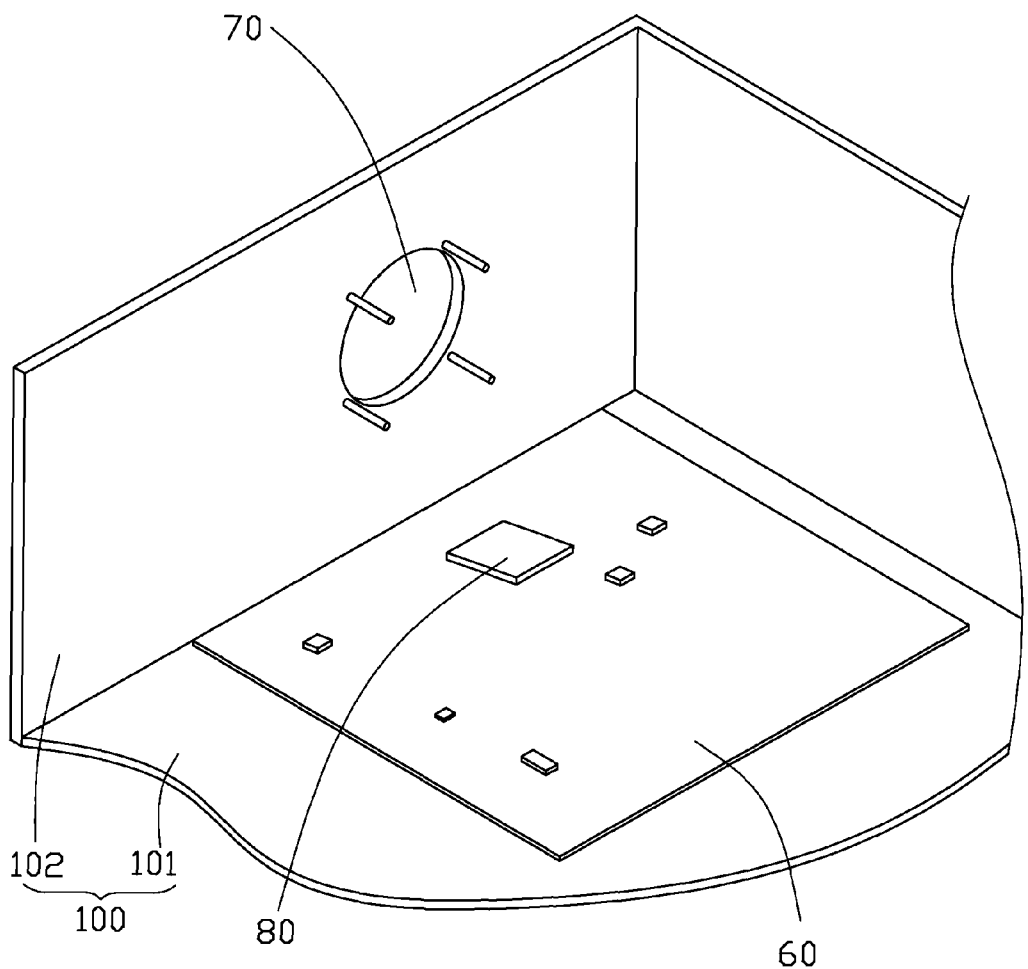
FIG. 2 is a schematic view of the computer of FIG. 1 without the heat dissipation device.

Referring to FIGS. 1-2, a heat dissipation device 90 in accordance with a first embodiment of the disclosure is shown. The heat dissipation device 90 is received in a casing 100 of a computer for dissipating heat from an electronic component 80 such as a CPU (central processing unit), a North Bridge chip or a displaying chip which is arranged on a printed circuit board 60 of the computer. The heat dissipation device 90 includes a fin unit 10, a fan 30, and a fan duct 20 connecting the fin unit 10 with the fan 30.

The casing 100 includes a bottom wall 101 and a side wall 102 extending upwardly and perpendicularly from an outer periphery of the bottom wall 101. The printed circuit board 60 is arranged on the bottom wall 101. The side wall 102 defines a ventilating hole 70 for communicating an interior of the casing 100 with an exterior of the casing 100.

Figure 3:
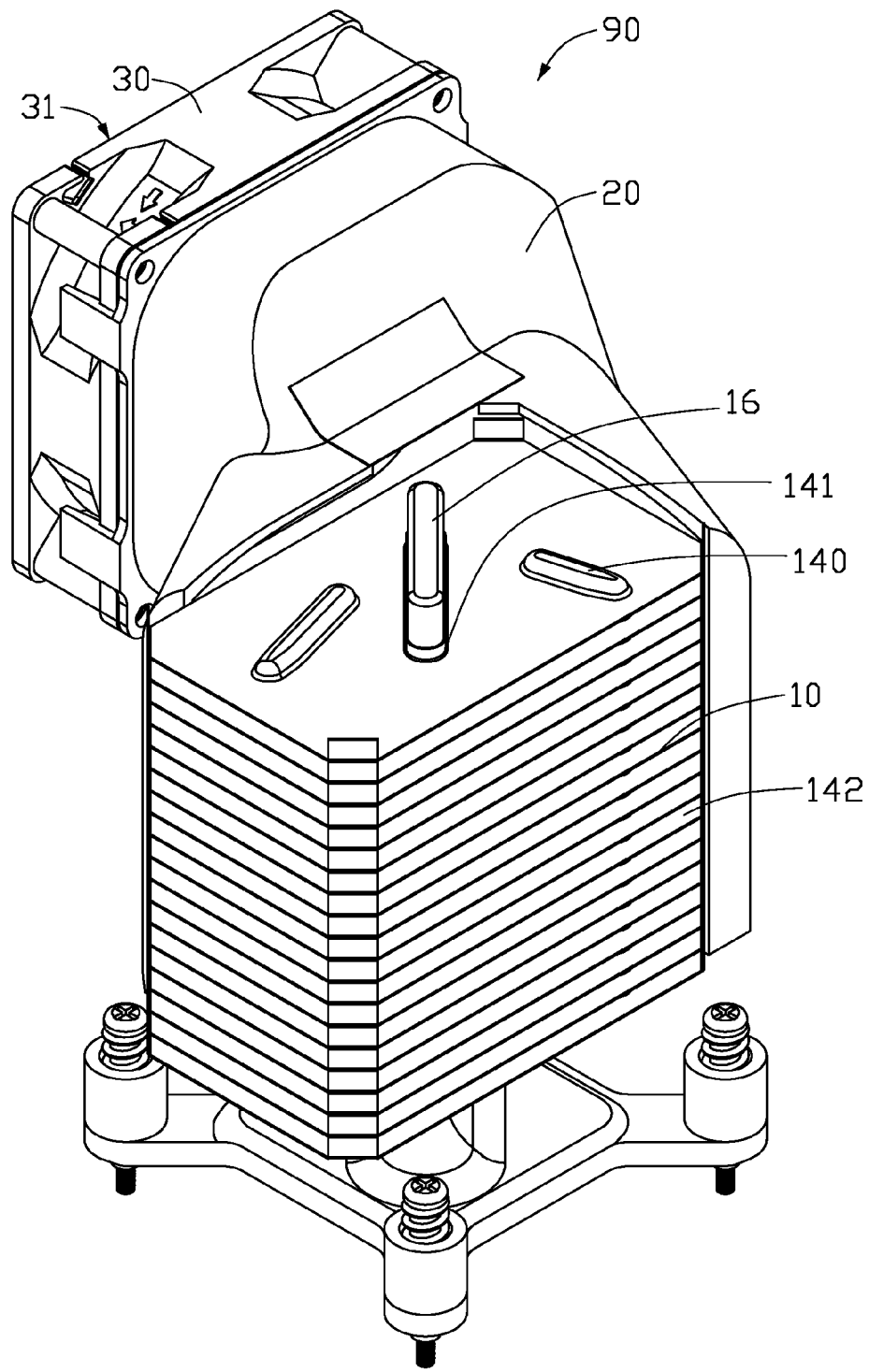
FIG. 3 is an assembled, isometric view of the heat dissipation device of FIG. 1.
Figure 4:
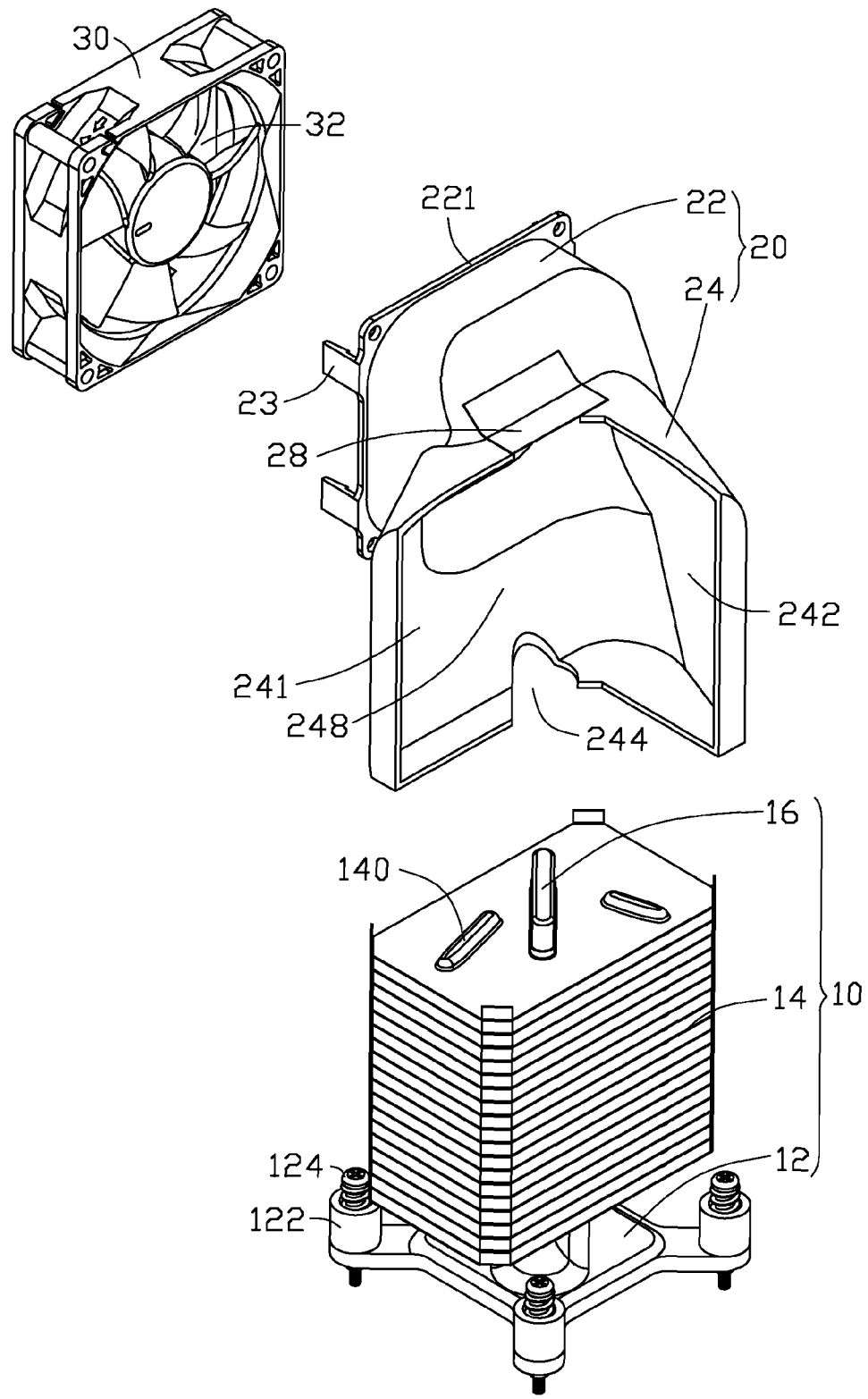
FIG. 4 is an exploded view of the heat dissipation device of FIG. 3.

The fan 30 is mounted to the side wall 102 of the casing 100. Referring to FIGS. 3 and 4, the fan 30 defines a circular air outlet 31 facing the ventilating hole 70 of the casing 100 and an opposite air inlet 32 facing the fan duct 20.

Figure 5:
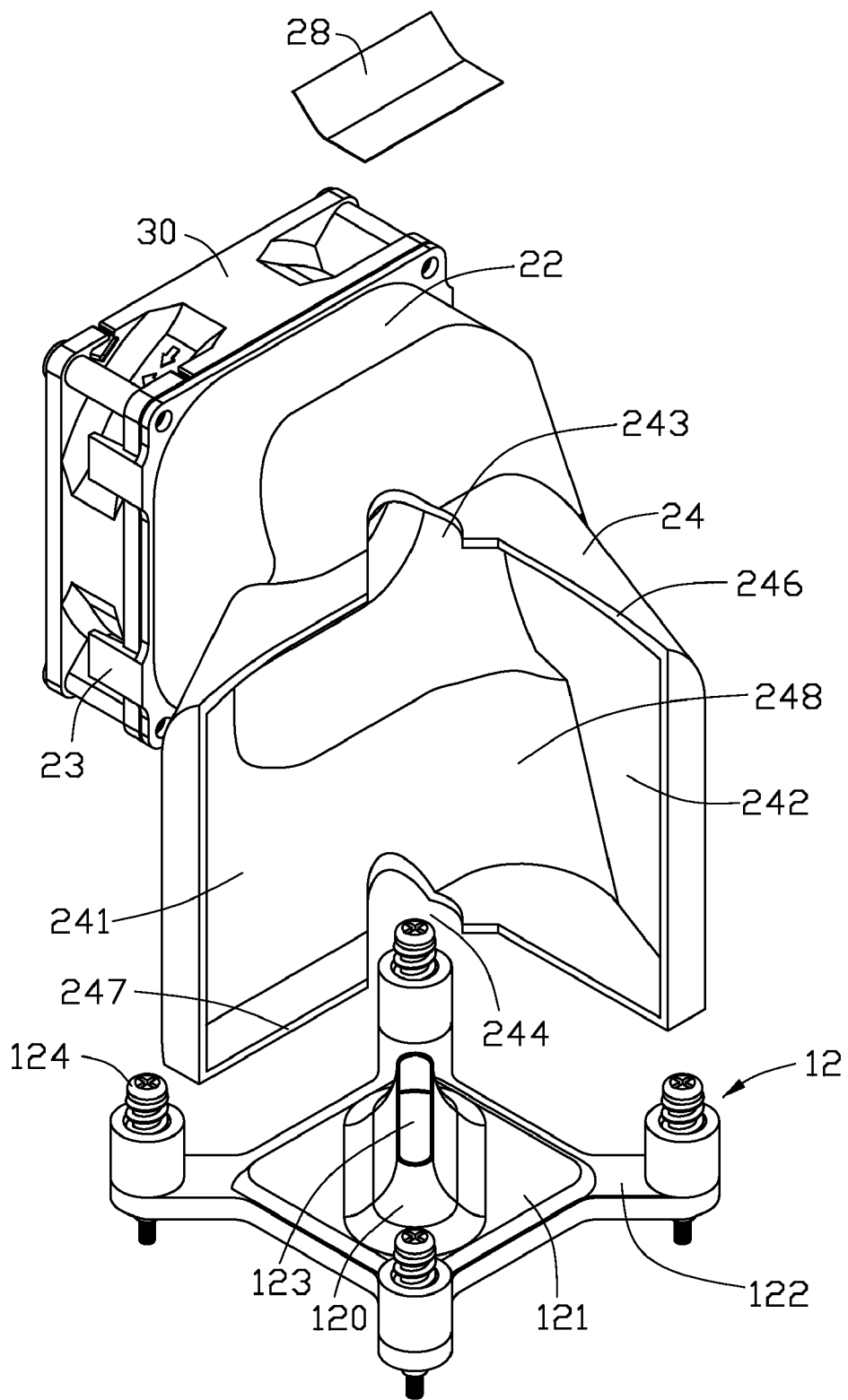
FIG. 5 is an exploded view of a base and a fan duct of the heat dissipation device of FIG. 3.

The fin unit 10 includes a base 12, a plurality of stacked fins 14 arranged on a top side of the base 12 and a heat pipe 16 thermally connecting the base 12 with the fins 14. Referring to FIG. 5 together, the base 12 includes a rectangular main plate 121 and four elongated fixing arms 122 extending outwardly from four corners of the main plate 121, respectively. The main plate 121 defines a receiving recess 123 along a diagonal line thereof. A hem 120 extends upwardly and perpendicularly from an outer periphery of the receiving recess 123 of the main plate 121. During assembly, four fasteners 124 respectively traverse through distal ends of the fixing arms 122 and engage into the printed circuit board 60 on which the electronic component 80 is mounted, for maintaining a firm contact between the electronic component 80 and the base 12.

The heat pipe 16 has a flat type configuration and is straight, and includes an evaporator end and a condenser end. The evaporator end is inserted into the receiving recess 123 of the base 12 with the hem 120 surrounded an outer surface thereof. The heat pipe 16 is perpendicular to the base 12. The fins 14 are stacked along the condenser end and paralleled to and spaced from each other. Each fin 14 is substantially rectangular, and defines an aperture 141 along a diagonal line thereof for extension of the condenser end of the heat pipe 16 therein. An airflow channel 142 is defined between each two neighboring fins 14. Two guiding members 140 are formed on two sides of the aperture 141 of each fin 14, respectively. The two guiding members 140 of each fin 14 form a converged side towards a middle of the aperture 141 and an opposite diverged side.

Figure 6:
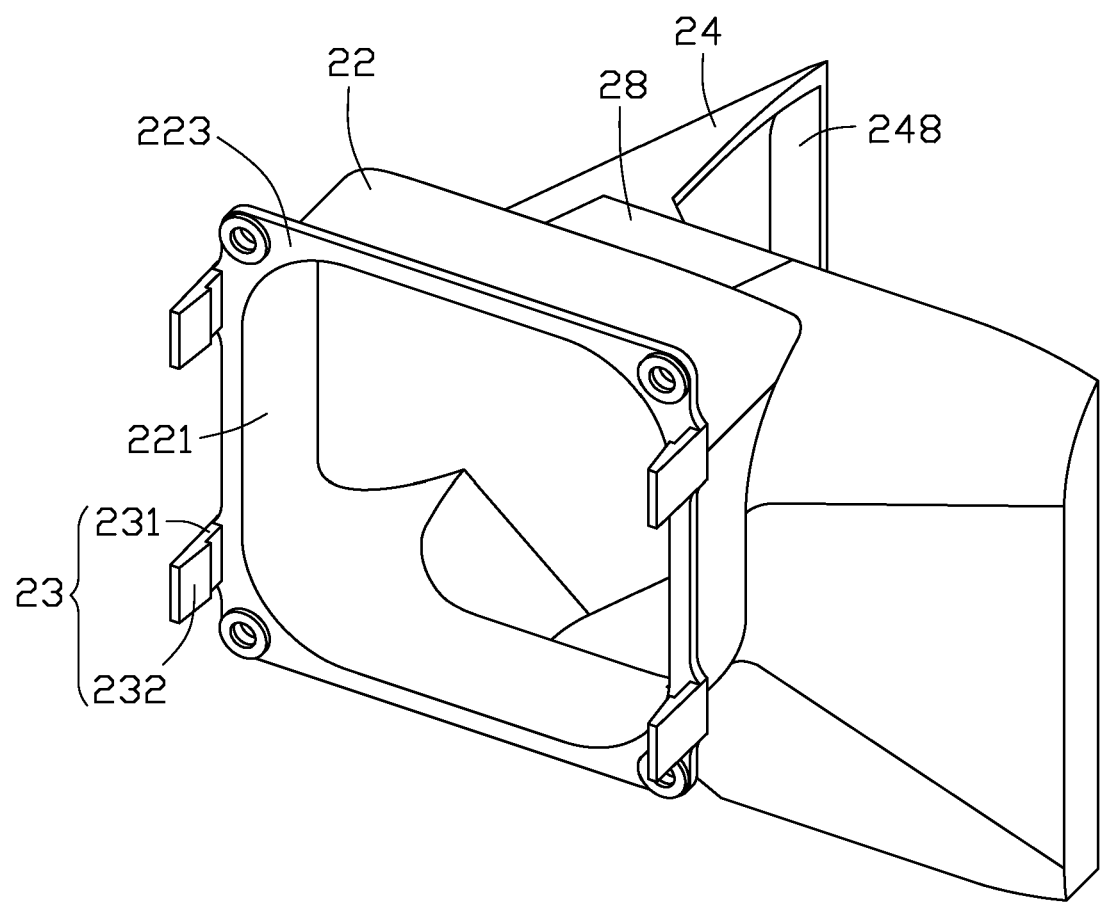
FIG. 6 is an isometric view of the fan duct of FIG. 5, viewed from another aspect.

The fan duct 20 includes first and second flues 22, 24 which are oriented generally perpendicular to each other. The first and second flues 22, 24 are integrally formed by molding. Referring to FIG. 6 together, an opening end 221 of the first flue 22 adjacent to the fan 30 has a rectangular cross-section corresponding to the fan 30. A rectangular, annular flange 223 extends outwardly from the opening end 221 of the first flue 22 with four through holes defined at four corners thereof, respectively. A plurality of locking units 23 are formed on opposite sides of the flange 223. Each of the locking units 23 includes a connecting pole 231 extending perpendicularly from an outer periphery of the flange 223 and a hook 232 bending inwardly from a free end of the connecting pole 231 towards the fan 30. The hooks 232 fasten an edge of the fan 30 to connect the fan duct 20 to the fan 30.

The second flue 24 includes a main plate 241 located below the first flue 22 and a rear side plate 242 extending perpendicularly and rearwards from a right side of the main plate 241, a generally L-shaped top flange 246 extending perpendicularly and rearwards from a bottom, rear end of the first flue 22 and perpendicularly and inwardly from a top end of the rear side plate 242, and a generally L-shaped bottom flange 247 extending perpendicularly and rearwards from a bottom end of the main plate 241 and perpendicularly and inwardly from a bottom end of the rear side plate 242. The main and rear side plates 241, 242 are perpendicular to each other. The top and bottom flanges 246, 247 and the main and rear side plates 241, 242 cooperatively define a space 248 therebetween, which accommodates the fin unit 10 therein, with two neighboring sides, i.e., front and right sides of the fin unit 10 located adjacent to the main and rear side plates 241, 242, respectively. The space 248 is in communication with an interior of the first flue 22. A top cutout 243 is defined in a right of a portion of the L-shaped top flange 246 extending rearwards from the rear, bottom end of the first flue 22. Similarly, a bottom cutout 244 is defined in a right of a portion of the L-shaped bottom flange 247 extending rearwards from the bottom end of the main plate 241. Each fin 14 is perpendicular to the main and rear side plates 241, 242, and the airflow channels 142 defined between each two neighboring fins 14 are perpendicular to the main and rear side plates 241, 242, respectively.

When assembled, the hooks 23 fasten the edge of the fan 30 to connect the fan duct 20 to the fan 30. The fan 30 is secured to the side wall 102 of the casing 100 by conventional means, such as screws or bolts. The fan 30 has the air inlet 32 aimed with the opening end 221 of the first flue 22, and the air outlet 31 aimed with the ventilating hole 70 of the casing 100. Thus, the interior of the casing 100 communicates with the exterior of the casing 100 via the fan duct 20, the air inlet 32, the air outlet 31 and the ventilating hole 70 in sequence. The fin unit 10 is received in the space 248 of the second flue 24 with the main and rear side plates 241, 242 abutting against the front and right sides of the fin unit 10, respectively. The converged side of the guiding members 140 of each fin 14 face the junction of the main and rear side plates 241, 242. The diverged side of the guiding members 140 of each fin 14 faces the interior of the casing 100 away from the fan duct 20. A converge way is defined between the guiding members 140 of each fin 14 towards the fan duct 20. The airflow channel 142 of each two neighboring fins 14 communicates with the interior of the casing 100. The top flange 246 locates over a top surface of a topmost fin 14 of the fin unit 10. The bottom flange 247 locates over the bottom surface of a bottommost fin 14 of the fin unit 10. The airflow channel 142 of each two neighboring fins 14 communicates with the interior of the first flue 22 via a gap between the front side of the fin unit 10 and the main plate 241 and a gap between the right side of the fin unit 10 and the rear side plate 242. Thus, air inside the casing 100 can flow into the fan duct 20.

The base 12 is located below a bottom side of the second flue 24 with one fastener 124 extending into the bottom cutout 244 of the bottom flange 247, and the other three fasteners 124 located surrounding a bottom of the space 248 of the second flue 24. The fasteners 124 are respectively screwed into the distal ends of the fixing arms 122 and further into the printed circuit board 60 for connecting the base 12 to the printed circuit board 60. A tool (not shown) can be inserted into the space 248 from the top cutout 243 downwardly towards the bottom cutout 244 for carrying out such connecting between the one fastener 124 and the printed circuit board 60. Subsequently, a patch 28 (FIG. 4) such as an adhesive tape is provided for sealing the top cutout 243 of the second flue 24. The electronic component 80 is located under the base 12 and faces the evaporator end of the heat pipe 16.

In operation of the heat dissipation device 90, the base 12 and the evaporator end of the heat pipe 16 absorb heat from the electronic component 80; the heat is spread on the fins 14 via the heat pipe 16; the fan 30 rotates at a high speed to cause air inside the casing 100 to flow into the airflow channels 142 of the fins 14 from rear and left sides of the fin unit 10 as indicated by arrows in FIG. 1; the air is blown as cooling airflow towards the fins 14 to take heat therefrom; and finally the air flows into the fan duct 20 and is exhausted to the exterior of the casing 100 via the fan 30 and the ventilating hole 70 of the casing 100. The heat spread on the fins 14 is carried by the flow of the cooling air and is further dissipated to the exterior of the casing 100 from the ventilating hole 70.

Since the main and rear side plates 241, 242 abut against the front and right sides of the fin unit 10, respectively, and the top flange 246 and the patch 28 cooperatively cover on a top end of the gap defined between the main and rear side plates 241, 242 and the fin unit 10, an air passageway for the airflow inside the casing 100 to flow to the exterior of the casing 100 is formed within the fan duct 20. That is, cooling air inside the casing 100 can first blows into the airflow channels 142 to exchange heat with the fins 14, and then the hot air after flowing through the fins 14 flows in the fan duct 20 along the air passageway to the exterior of the casing 100 without leakage. Furthermore, when the cooling airflow blows into the airflow channels 142, the guiding members 140 of each fin 14 can guide the airflow to flow to a hot area around the heat pipe 16 and directly to the interior of the first flue 22, which results in increasing heat-dissipating efficiency of the heat dissipation device 90. Moreover, as the air flows in to the fin unit 10 from rear and left sides, heat generated by other electronic components which are located at the front and right sides of the CPU can be efficiently carried away simultaneously, thus increasing utilization of the airflow.

It is to be understood, however, that even though numerous characteristics and advantages of the disclosure have been set forth in the foregoing description, together with details of the structure and function of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat dissipation device comprising:
   a fin unit comprising a plurality of fins stacked together, an airflow channel being defined between each two neighboring fins;
   a fan comprising an air inlet and an opposite air outlet; and
   a fan duct communicating with the airflow channels of the fin unit and the fan, the fan duct comprising a first flue connected to the air inlet of the fan and a second flue connected to the fin unit, the second flue comprising a first side plate and a second side plate covering on two neighboring sides of the fin unit, respectively;
   wherein a gap is defined between each of the first and second side plates of the second flue of the fan duct and a corresponding side of the fin unit, and the gap communicates with the airflow channels; and
   wherein the second flue comprises a top flange extending rearwards from a rear, bottom end of the first flue and inwardly from a top end of the second side plate, the top flange located above the fin unit and enclosing top ends of the gaps.

2. The heat dissipation device of claim 1, wherein the fin unit further comprises a base which comprises a main plate supporting the fins thereon and a plurality of fixing arms extending outwardly from the main plate for fasteners respectively traversing through distal ends thereof.

3. The heat dissipation device of claim 2, wherein the fin unit further comprises a heat pipe thermally connected to the base with the fins, the main plate defining a receiving recess for receiving one end of the heat pipe therein, the fins stacked along another end of the heat pipe.

4. The heat dissipation device of claim 3, wherein each fin is rectangular, and defines an aperture along a diagonal line thereof for extension of the heat pipe therethrough, two guiding members being formed on two sides of the aperture, respectively, the guiding members forming a converged side towards a junction of the first and second side plates and an opposite diverged side.

5. The heat dissipation device of claim 2, wherein top and bottom flanges are formed by the fan duct for being located over and under top and bottom surfaces of the fin unit, respectively, a bottom cutout is defined in the bottom flange for one of the fasteners to extend therethrough, and a top cutout aligning with the bottom cutout is defined in the top flange.

6. The heat dissipation device of claim 5, wherein a patch covers the top cutout of the top flange.

7. The heat dissipation device of claim 1, wherein a plurality of locking units are formed on the first flue, each of the locking units comprising a hook which fastens an edge of the fan to connect the fan duct to the fan.

8. A computer comprising:
a casing defining a ventilating hole for communicating an interior of the casing with an exterior of the casing;
an electronic component received in the casing; and
a heat dissipation device mounted on the electronic component, the heat dissipation device comprising:
a fin unit comprising a plurality of fins stacked together, an airflow channel being defined between each two neighboring fins;
a fan comprising an air outlet facing the ventilating hole of the casing and an opposite air inlet, the fan being configured for sucking air inside the casing and out to the exterior of the casing; and
a fan duct comprising a first flue connected to the air inlet of the fan and a second flue connected to the fin unit, the second flue comprising a first side plate and a second side plate covering two neighboring sides of the fin unit, respectively, the fan duct communicating with the airflow channels of the fin unit and the fan;
wherein a gap is defined between each of the first and second side plates and a corresponding side of the fin unit, the gap communicating with the airflow channels of the fin unit, a top flange extending rearwards from a rear, bottom end of the first flue and inwardly from a top end of the second side plate towards the fin unit and covering top ends of the gaps.

9. The computer of claim 8, wherein a plurality of locking units are formed on the first flue, each of the locking units comprising a hook which fastens an edge of the fan to connect the fan duct to the fan.

10. A heat dissipation device comprising:
a fin unit comprising a plurality of fins stacked together, a base which comprises a main plate supporting the fins thereon, and a plurality of fixing arms extending outwardly from the main plate for fasteners respectively traversing through distal ends thereof, an airflow channel being defined between each two neighboring fins;
a fan comprising an air inlet and an opposite air outlet; and
a fan duct communicating with the airflow channels of the fin unit and the fan, the fan duct comprising a first flue connected to the air inlet of the fan and a second flue connected to the fin unit, the second flue comprising a first side plate and a second side plate covering two neighboring sides of the fin unit, respectively;
wherein top and bottom flanges are formed by the fan duct and are located over and under top and bottom surfaces of the fin unit, respectively, a bottom cutout is defined in the bottom flange for one of the fasteners to extend therethrough, and a top cutout aligning with the bottom cutout is defined in the top flange.

11. The heat dissipation device of claim 10, wherein a patch covers the top cutout of the top flange.

\* \* \* \* \*